United States Patent [19]
Piety et al.

[11] Patent Number: 6,091,236
[45] Date of Patent: Jul. 18, 2000

[54] SYSTEM AND METHOD FOR MEASURING AND ANALYZING ELECTRICAL SIGNALS ON THE SHAFT OF A MACHINE

[75] Inventors: Richard W. Piety; Stewart V. Bowers, III; David Q. Gaddis, all of Knoxville, Tenn.

[73] Assignee: CSI Technology, Inc., Wilmington, Del.

[21] Appl. No.: 08/842,096

[22] Filed: Apr. 28, 1997

[51] Int. Cl.⁷ .................................................. G01R 23/00
[52] U.S. Cl. ...................... 324/103 P; 324/545; 340/679; 340/682
[58] Field of Search ................................ 324/103 P, 772, 324/72.5, 545, 174; 361/239, 23, 29, 30; 340/540, 672, 686.3, 679, 682

[56] References Cited

U.S. PATENT DOCUMENTS

| | | | |
|---|---|---|---|
| 4,200,816 | 4/1980 | Hopkins | 340/672 |
| 5,006,769 | 4/1991 | Posedel | 318/434 |
| 5,231,374 | 7/1993 | Larsen et al. | 340/540 |
| 5,248,939 | 9/1993 | Brauer | 324/174 |
| 5,274,336 | 12/1993 | Crook et al. | 324/690 |
| 5,424,630 | 6/1995 | Vazquez | 324/72.5 |
| 5,521,482 | 5/1996 | Lang et al. | 318/800 |
| 5,726,911 | 3/1998 | Canada et al. | 364/550 |

OTHER PUBLICATIONS

"Shaft Currents In Electric Machines", P. Alger and H. Samson, A.I.R.E. Conference, Feb. 1924.

"Electrically Induced Bearing Damage, The Need for Shaft Grounding", Hugh Boyanton, CSI Users' Conference, 1994. (no month).

"Preventing Motor Shaft–Current Bearing Failures", Peter Walker, Plant Engineering, Oct. 4, 1990.

"Preventing Premature Failure of Bearings in motors Driven by PWM ASDs", EPRI Power Electronics Applications Center, Note No. 8, May 1996.

"Bearing Currents and Their Relationsip to PWM Drives", D. Busse, J. Erdman R.J. Kerkman, D. Schlegel and G. Skibinski; IECON '95, IEEE 21st Annual Industrial Electronics Conference, Nov. 6–10, 1995, vol. 1, pp. 698–705.

"Shaft Voltages and Rotating Machinery", Michael J. Costello, IEEE Paper No. PCIC–91–13, Jul. 1991.

"The Causes and the Control of Electronic Currents in Bearings", J. Boyd and H.N. Kaufman, Lubrication Engineering, Jan. 1959.

"Bearing Installation and Maintenance Guide", SKF 140–710, pp. 80–81, Aug. 1988.

"Bearing Failure Prevention Guide", FAFNIR, pp. 14–15. (no month available).

"Effect of PWM Inverters on AC Motor Bearing Currents and Shaft Voltages", J. Erdman, R.J. Kerkman, D. Schlegal, and G. Skibinski, APEC 95, Tenth Annual Applied Electronics Conference and Exposition, Mar. 5–9, 1995, vol. 1, pp. 24–33.

(List continued on next page.)

*Primary Examiner*—Josie Ballato
*Assistant Examiner*—Jose M. Solis
*Attorney, Agent, or Firm*—Luedeka, Neely & Graham, PC

[57] ABSTRACT

The present invention provides a system and method for monitoring an electrical signal appearing on a rotating machine shaft. The system comprises a probe assembly for placement against the rotating machine shaft that is in electrically conductive contact with the shaft. The probe assembly includes at least one circuit for receiving the electrical signal from the rotating machine shaft and producing various electrical signals that are read by a data processing system, which is coupled to the circuit. The data processing system determines from the electrical signal obtained from the circuit, the RMS AC voltage, DC voltage, peak voltage, and the RMS AC and DC current through two different resisters that are all appearing on the rotating machine shaft. The data processing system also performs Fast Fourier Transforms on the RMS voltage and current signals and produces a frequency spectrum over time.

17 Claims, 12 Drawing Sheets

OTHER PUBLICATIONS

"System Electrical Parameters and Their Effects on Bearing Currents" D. Busse, J. Erdman, R. J. Kerkman, D. Schlegal, and G. Skibinski, APEC '96, Eleventh Annual Applied Power Electronics Conference and Exposition, Mar. 3–7, 1996.

"The Effects of PWM Voltage Source Inverters on hte Mechanical Performance of Rolling Bearings", D. Busse, J. Erdman, R.J. Kerkman, D. Schlegal, and G. Skibinski, APEC '96, Eleventh Annual Applied Power Electronics Conference and Exposition, Mar. 3–7, 1996.

SYSTEM AND METHOD FOR MEASURING AND ANALYZING ELECTRICAL SIGNALS ON THE SHAFT OF A MACHINE

BACKGROUND

1. Field of the Invention

The present invention relates generally to the maintenance of machinery having a rotating shaft and, more particularly, to a system and method for measuring and analyzing electrical signals appearing on the rotating shaft of the machinery.

2. Description of the Related Art

It is well known that electric machines have some level of shaft voltage during operation. A number of specific sources may result in the appearance of voltage on a rotating shaft of an electrical machine. Variations in air gaps, windings, and metal (rotor and frame) result in a fluctuating magnetic field, which is cut by conducting material. This condition gives rise to a current loop among the shaft, bearings, and casing. For most machines this is not a significant problem. Very large machines and vertical machines are common candidates for these type of isometrics. In the past, this problem has typically been addressed by insulating the non-driver bearing, thereby breaking the current loop.

Residual magnetism can also be a source of rotating machine shaft currents. Even insulating the bearings of the machine may still allow a circulating current to exist in the bearings themselves. Another source causing voltage to appear on the shaft of a machine are electrostatic sources such as belts, charged particulate, charged oil, and sheet processes. Unless properly grounded, voltage will increase or build up until it can overcome the insulating material in the lubricant film and discharge through a bearing. Since the electrical characteristics of a bearing will vary with speed, lubricant, and clearances, the voltage magnitude or level required to "punch through" the oil film will vary. The higher the voltage magnitude, the greater the potential for damage to occur on the machine.

Although current is typically the damaging force for machine bearings, it is difficult to measure in field applications; especially levels due to capacitively based voltage peaking or spiking. Even when RMS based current measurements are low, damage from pulsed discharges on the rotating machine shaft can be severe. The application of current measuring test instruments tends to eliminate the capacitive charges, effectively hiding their presence. Relying on voltage measurements does reveal the potential for discharges to be occurring across the bearing/lubricant interface. When evaluating severity of the electrical signals appearing on a rotating shaft, several factors are typically considered, such as: a history of unexplained chronic bearing failure; examination of bearings of this or similar machines showing damage of an electrical origin; and typical voltage values measured on similar machines.

The standard practice for electrical machines with an induced voltage is to insulate the non-driver bearing, thereby breaking the loop that may exist from the rotor through the bearings and casing. If, however, the voltage is capacitive in nature, the voltage potential can build up or ramp until damaging levels of current pass through lubricant films in the machine or tachometer bearings. In such cases, a shaft grounding system may be required to diminish the voltage potential and to provide an alternate path for these high levels of voltage to discharge. It is known that grounding the machine shaft is the best way to prevent high levels of voltage from accumulating thereon and this application has been widely used in the industry. Although not all electrical machines experience these problems, variable speed electric machines (AC or DC), fans, blowers handling particulate, sheet processes, and some belt drives can be especially prone to these problems. In addition, variable speed drives can aggravate the problem.

As mentioned, machine faults due to the presence of shaft voltages and currents are often characterized by chronic bearing problems where no other logical root cause is apparent such as misalignment, overheating, or misapplication. Even when a shaft grounding system has been installed on the machine with the rotating shaft, the resistance between the grounding pick-up and shaft may increase, until it is no longer effective. Due to the nature of the voltage appearing on the rotating shaft, standard RMS voltmeters can be misleading when used to measure the voltage potential on the shaft because often the voltage is not at standard line frequencies, such as in the range of 50 or 60 hertz, may be erratic in frequency, and may occur as voltage peaks or spikes instead of being sinusoidal in nature. Therefore, a high frequency digital oscilloscope may detect spikes of 40 to 70 volts when an RMS measurement detects only 1 to 2 volts or less. It is a mistake to focus only on the RMS voltage and currents since voltage spikes due to capacitive type discharging can cause significant bearing damage in the machine.

It is therefore desirable in the art to have a system and method for measuring electrical signals on a rotating shaft of a machine that displays accurate measurements of RMS shaft voltage, peak voltage, and RMS current. It would also be desirable in the art to have a means of computing a Fast Fourier Transform on these electrical signals that appear on the rotating machine shaft and producing frequency spectrums as a function of time for easy readout by a system operator.

SUMMARY OF THE INVENTION

The present invention eliminates the disadvantages inherent in the prior art by providing a system and method for monitoring an electrical signal appearing on a rotating machine shaft. The system includes a probe assembly for placement against the rotating machine shaft and is in electrically conductive contact with the shaft. The probe assembly includes a circuit for receiving the electrical signal from the rotating machine shaft and producing various electrical signals that are read by a data processing system, which is coupled to the circuit. The data processing system can determine from the electrical signal obtained from the circuit one or more of the following: (1) RMS AC voltage; (2) DC voltage; (3) peak voltage; and (4) RMS AC and DC current through two different resistors are appearing on the rotating machine shaft. The data processing system can also perform Fast Fourier Transforms on the RMS voltage and current signals and produce a frequency spectrum over time.

Other objects, features and advantages of the present invention will become apparent by reference to the following detailed description when considered in conjunction with the accompanying drawings.

DESCRIPTION OF THE PREFERRED EMBODIMENTS

Figure 1:
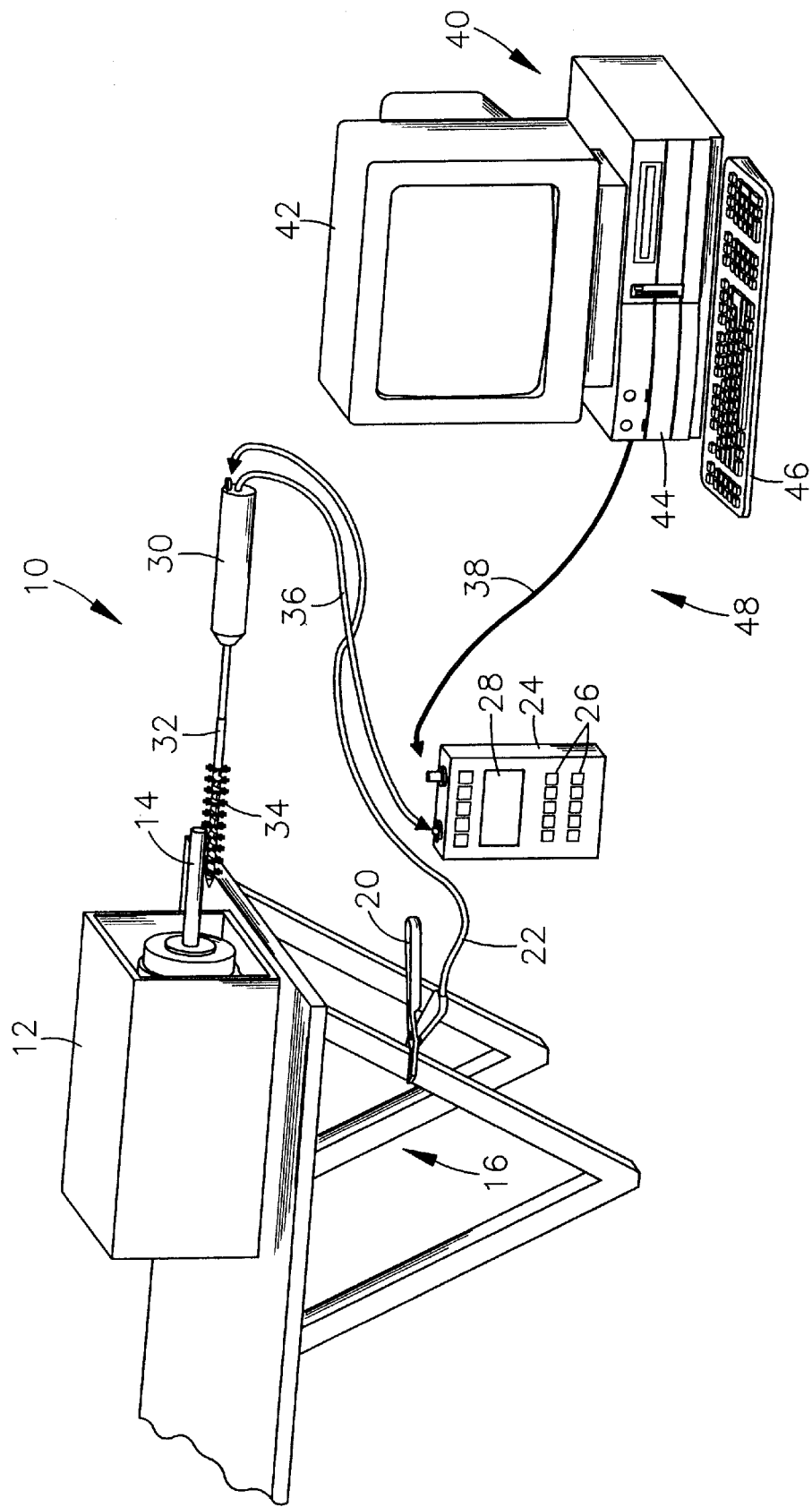
FIG. 1 is a perspective view of a probe assembly and a microprocessor based data processing system of the present invention.

FIG. 1 of the present invention shows an overview of a system 10 for monitoring and analyzing an electrical signal on a rotating machine shaft 14. The electrical signals appearing on the machine shaft 14 are measured by a probe assembly 30 (preferably a CSI 348SP Shaft Probe), which electrically engages shaft 14. The probe assembly 30 is one of a set of measurement devices or transducers, that are connected via electrical signal lead 36 to a microprocessor based analyzer 24 of a data processing system 48. The analyzer 24 includes a keypad 26, a display 28 through which information may be displayed to an operator, and a microprocessor unit that includes a microprocessor, memory (volatile and nonvolatile), bus lines (address, control, and data), and other hardware, software, and firmware needed to perform the task of data manipulation of an electrical signal.

The analyzer 24 further includes a route of machines and for each machine specifies the type of information that will be acquired, namely current, voltage, and/or peak voltage. The operator can increment through the route sequentially or can move to a particular machine in the route by giving instructions through the keypad 26. Alternatively, the operator can identify a machine or rotating machine shaft that is not contained in a list in the memory. In such case, the operator may specify the type of information that is desired by inputting instructions through the keypad 26. The analyzer 24 will then respond by issuing appropriate commands to the probe assembly 30 to acquire the information in the manner requested. For example, the analyzer 24 could acquire two types of current signals and check them against each other to ensure accuracy or it could skip the check and just acquire one current signal. In addition, if desired, the analyzer 24 could collect an RMS voltage signal and a peak voltage signal. Then, the analyzer 24 could conduct further analysis of the signals, such as by conducting Fourier Transforms on the current and voltage signals.

The data processing system 48 also includes a base unit 40 that, in the preferred embodiment, takes the form of a conventional personal computer having a central processing unit 44, a keyboard 46, and a video display monitor 42.

A ground connector 20, such as a suitably sized "alligator clip" is provided for electrical connection to a frame 16 of an electric machine 12. The frame 16 is of the same electrical ground as the electrical machine 12. Disposed within the machine 12 is the rotatably mounted shaft 14. The rotating machine shaft 14 is subjected to electrical signals in the form of shaft voltage and current. A ground connector lead 22 extends between the ground collector 20 and the portable data connector 24, with an electrical ground reference connection to the actual probe 30 being completed via a conductor of the cable 36 that is operably collector to the probe 30. The portable data connector 24 and the base unit 40 are capable of at least periodically being linked for data transfer, as represented in the preferred embodiment by an RS232 communications link. It is appreciated by those skilled in the art, however, that any suitable link may be employed for data transfer such as an optical communications link, a radio communications link, or a removable memory card such as a PCMCIA card.

Generally, the base unit 40 is used for long-term data storage and more elaborate data analysis, it will be appreciated that the analyzer 24 may include significant data storage and processing capabilities. The distribution of computational and storage functions as between the base unit 40 and the analyzer 24 may vary depending on application. For example, in a less preferred embodiment, all of the functions of the base unit 40 may be embodied in the analyzer 24.

Referring again to the probe assembly 30, an electrically conductive stem 32 is attached to, and protrudes axially therefrom. The conductive stem 32 has a plurality of bristle brushes 34 (such as Model No. 7231T33, $\frac{7}{16}$ inch diameter, four-inch long, brass tube cleaning brush, available from McMaster-Carr supply company, in Atlanta, Ga., USA) attached thereon for placement against the rotating machine shaft 14 and for coming in electrical contact therewith.

Figure 2:
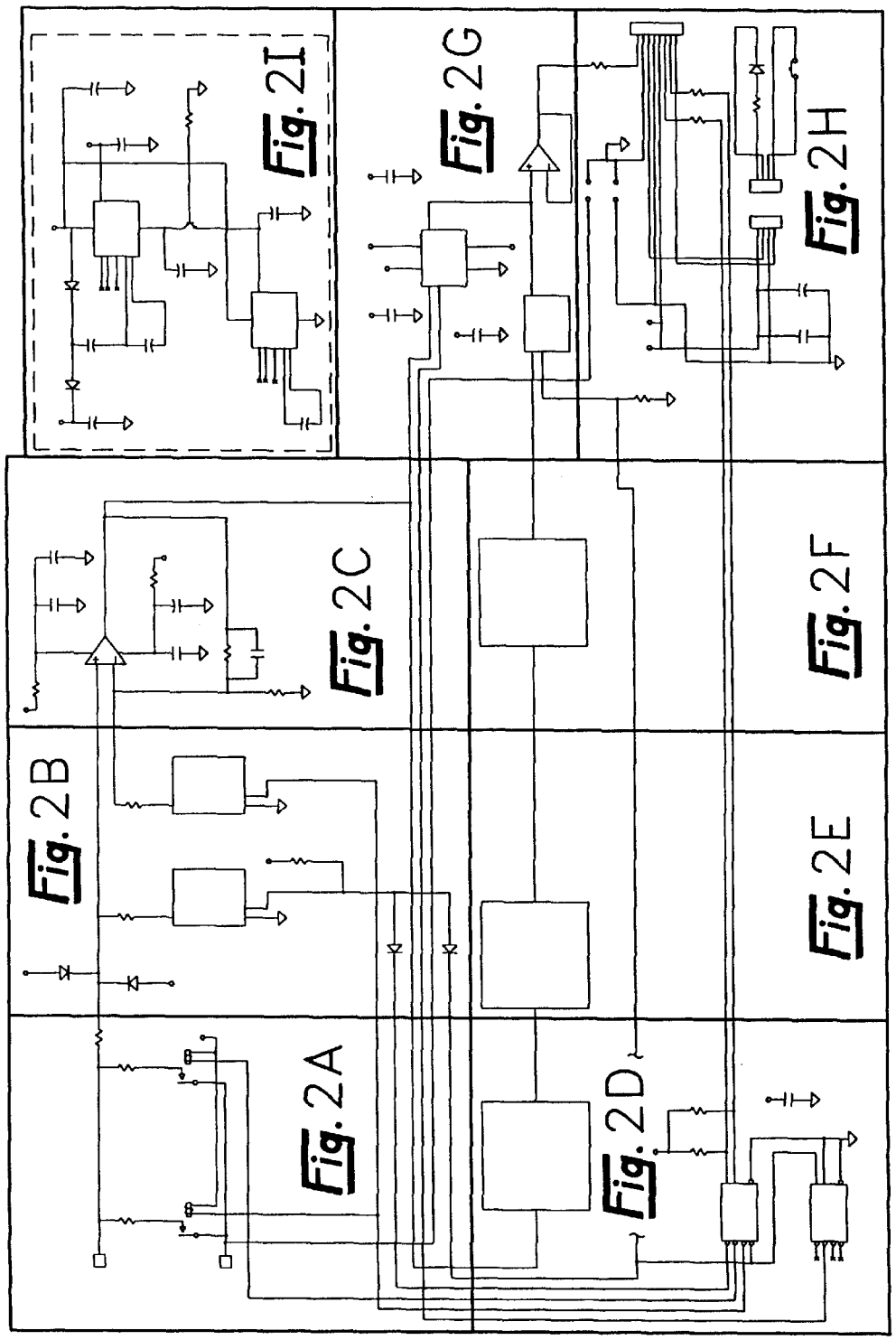
FIG. 2 is a circuit coupling diagram of the present invention.
Figure 2A:
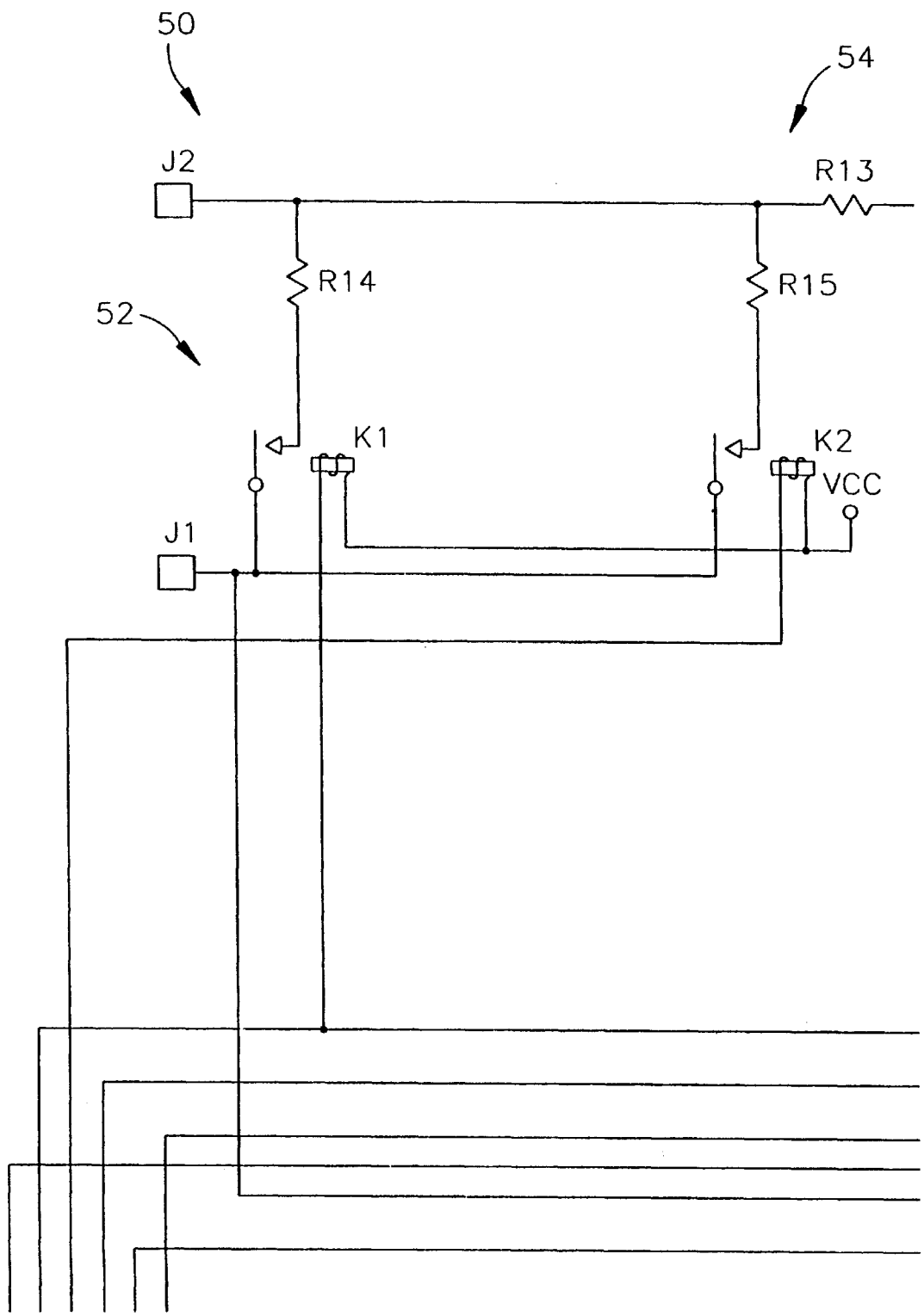
FIGS. 2A–2H are electrical schematic diagrams of circuitry coupled together that is included within the housing of the probe assembly of the present invention.

Referring now to FIG. 2, an electrical schematic flow chart diagram of circuitry included within the probe assembly 30 is shown. The electrical circuitry as shown in FIGS. 2A–2H includes an analog circuit 50 for sequentially measuring current on the rotating machine shaft 14. The circuit 50 includes a first voltage circuit 52 having a signal-in port J2 in electrical communication with the probe assembly 30 for receiving the electrical signal from the rotating machine shaft 14 and producing a first current signal. The first voltage circuit 52 further includes a signal-out port J5, shown in FIG. 2H. The signal-in port J2 has an output that is coupled to a first end of a first resistor R14. The first resistor R14 has a first resistance value and a second end. A first relay K1 is switchingly coupled between the second end of the first resistor R14 and ground so that when in a closed position current passes through the first resistor R14 to ground.

Circuit 50 further includes a second voltage circuit 54 having a signal-in port J2 in electrical communication with the probe assembly 30 for receiving the electrical signal from the rotating machine shaft 14 and producing a second current signal. The second voltage circuit 54 further includes a signal-out port J5, shown in FIG. 2H. The second voltage circuit 54 includes a second resistor R15 having a second resistance value. The second resistor R15 has a first end coupled to the output of the signal-in port J2 and a second end. The second voltage circuit 54 further includes a second relay K2 switchingly coupled between the second end of the second resistor R15 and ground so that when in a closed position current passes through the second resistor R15 to ground. Therefore, the circuit 50 operates in first and second modes for each first and second current signal produced from the probe signal, as described above. Each mode produces first and second mode signals for each first and second current signal parameter. The analyzer 24 selects and receives one of the first and second mode signals, analyzes the first and second mode signals, stores data corresponding to the first and second mode signals, and produces and transmits the analog control signals to analog circuit 50 to select the mode of operation of circuit 50. In addition, the analyzer 24 is operable to compare first and second current signals produced by circuit 50 and based thereon determine accuracy of the first and second current signals.

Figure 2B:
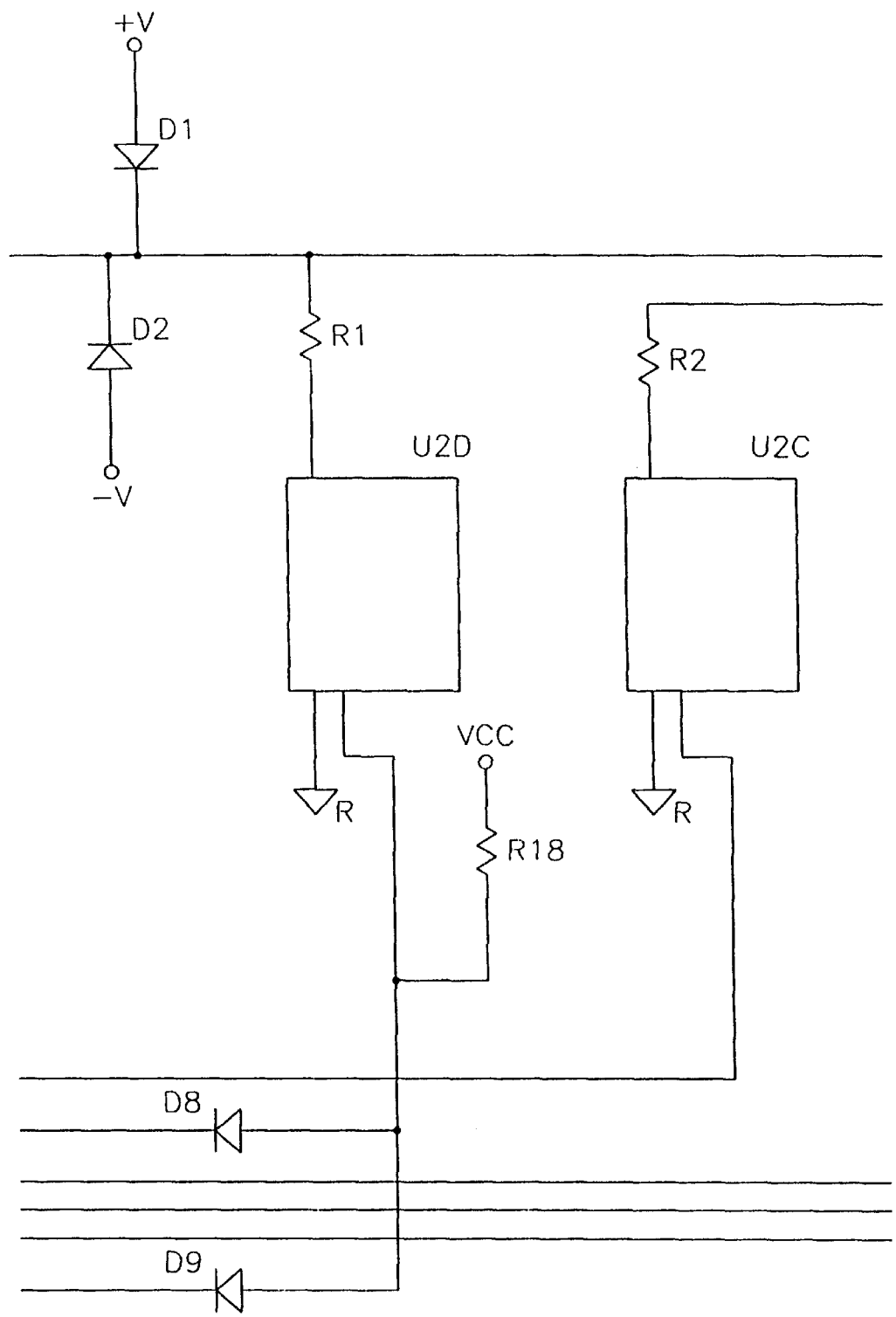
Figure 2C:
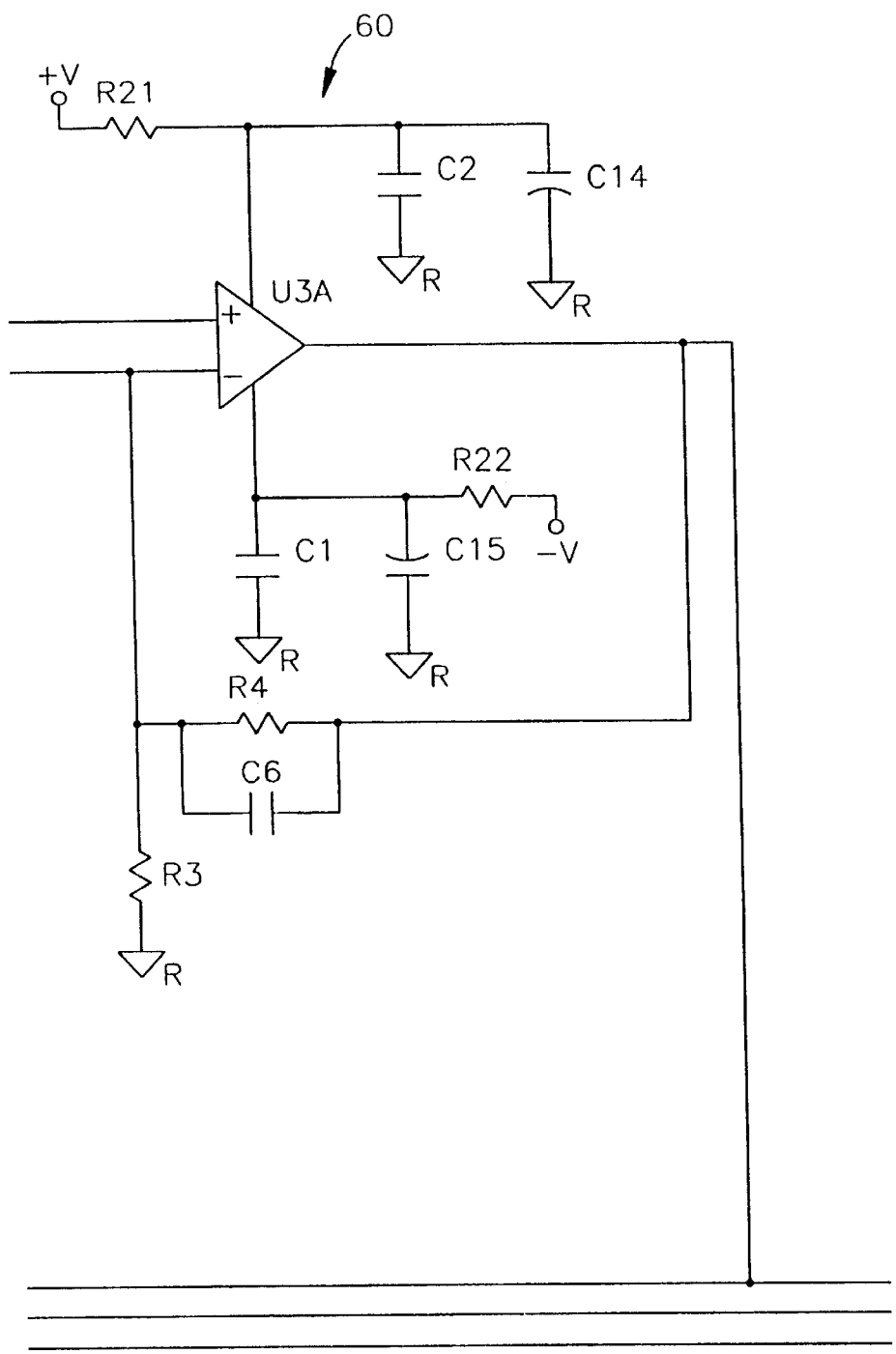
Figure 2D:
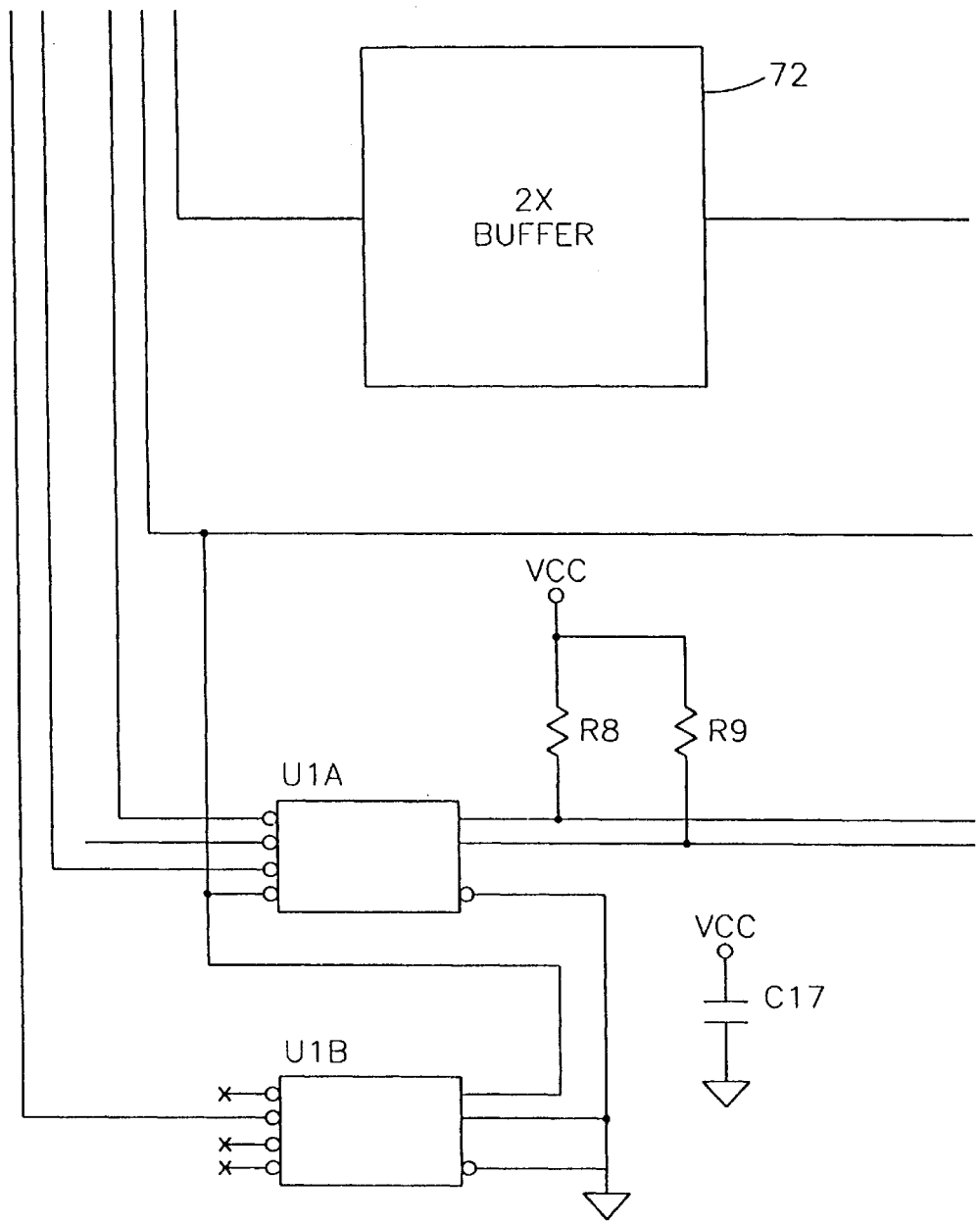
Figure 2E:
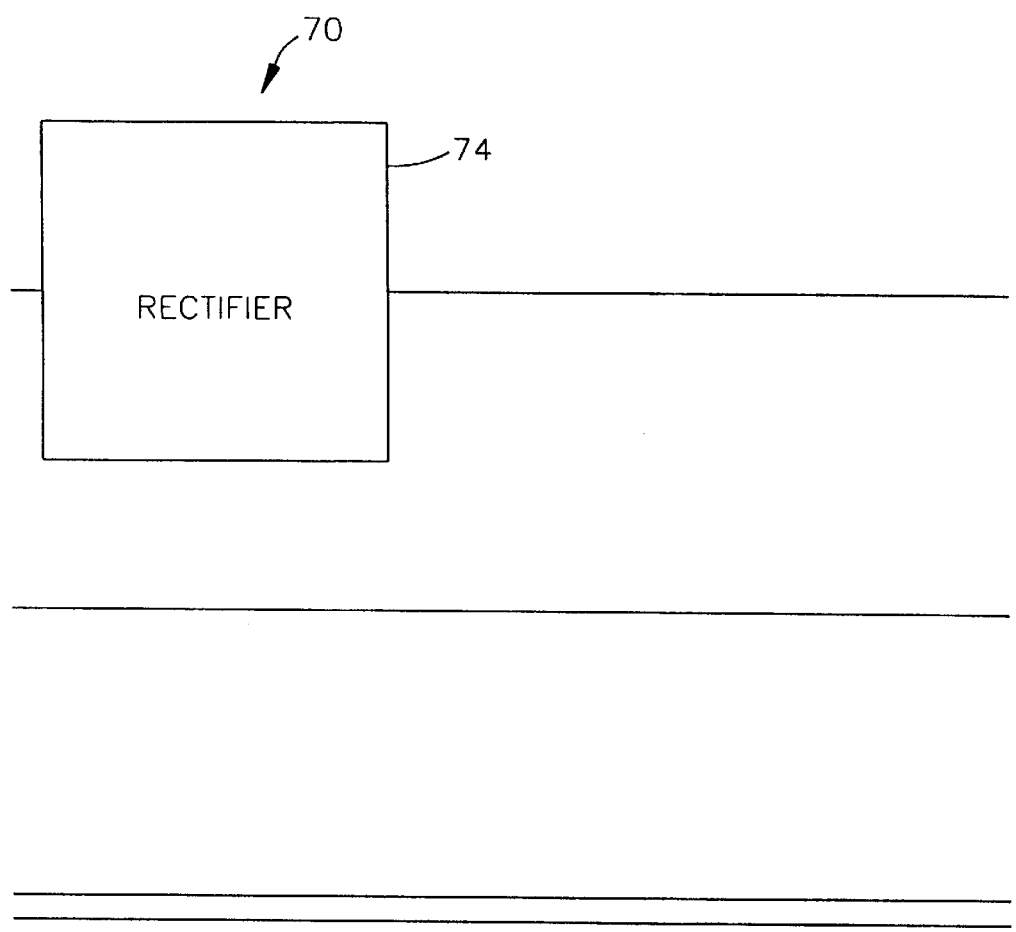

As shown in FIG. 2C, the circuit 50 for sequential current measuring of electrical signals on the rotating machine shaft 14 further includes an amplifier U3A having an input coupled to resistor R13, which in turn is coupled to the first end of the first resistor R14 and the first end of the second resistor R15 and the output of the signal-in port J2 for amplifying the electrical signal from the rotating machine shaft and creating an amplified electrical signal. As shown in FIG. 2G, the circuit 50 further includes a buffer U3B having an input and an output. Circuit 50 also includes an analog switch U2A coupled between the input and the buffer U3B and the output of the amplifier U3A for receiving the amplified electrical signal from the amplifier and switching the amplified electrical signal to the buffer U3B. In operation, one option to measure current on the rotating machine shaft 14 by circuit 50 is to close relay K1 so that the voltage appearing at the signal-in-port J2 passes through the first resistor R14 to ground. Thus, the voltage across the first resistor R14 represents current and it is applied through the amplifier U3A to the signal-out-port J5 as previously described. Another way for circuit 50 to measure current on the rotating machine shaft 14 is to close relay K2 so that the electrical signal passes through the second resistor R15 to ground. Thus, the voltage across the second resistor R15 also represents current and is supplied to the signal-out port J5 as previously described. The purpose of having a first resistor and second resistor both with different values for measuring current is to allow a comparison. Assuming the voltage remains constant, the currents flowing through the first resistor R14 and the second resistor R15 should vary by a set factor. Also included in a circuit 50, and shown in FIG. 2B, is a switch U2D that is connected to the second end of resistor R1, which has a first end connected to resistor R13. The switch U2D is also connected to ground and is an attenuator so that the electrical signal applied to the amplifier U3A may be attenuated, if necessary, when measuring any of the electrical signals appearing on the rotating machine shaft 14. Further included in circuit 50 is switch U2C that is coupled between ground and resistor R2 for acting as a gain resistor that changes the gain of amplifier U3A.

Shown in FIGS. 2A–2H, is an RMS voltage circuit 60. The circuit 60 includes a signal-in port J2 that has input in electrical communication with the electrical signal from the rotating machine shaft 14 via the probe assembly 30. The signal-in port J2 also has an output that is coupled to an input of an amplifier U3A, as shown in FIG. 2C, for amplifying the electrical signal from the rotating machine shaft 14 and producing an amplified electrical signal therefrom at its output. As shown in FIGS. 2C and 2G, the RMS voltage circuit 60 further includes an analog switch U2A that is coupled between the input of buffer U3B and the output of the amplifier U3A for receiving the amplified electrical signal from the amplifier U3A and switching the amplified electrical signal to the signal-out port J5 via buffer U3B. In the preferred embodiment, the RMS voltage circuit 60 includes a buffer U3B that has an input coupled to the output of the analog switch U2A and an output that is coupled to the input of the signal-out port J5. In operation, when it is desired to measure RMS voltage via circuit 60, the electrical signal from the rotating machine shaft 14 passes through amplifier U3A and through analog switch U2A. The signal then passes through buffer U3B and plug J5 to the data processing system 48.

Figure 2F:
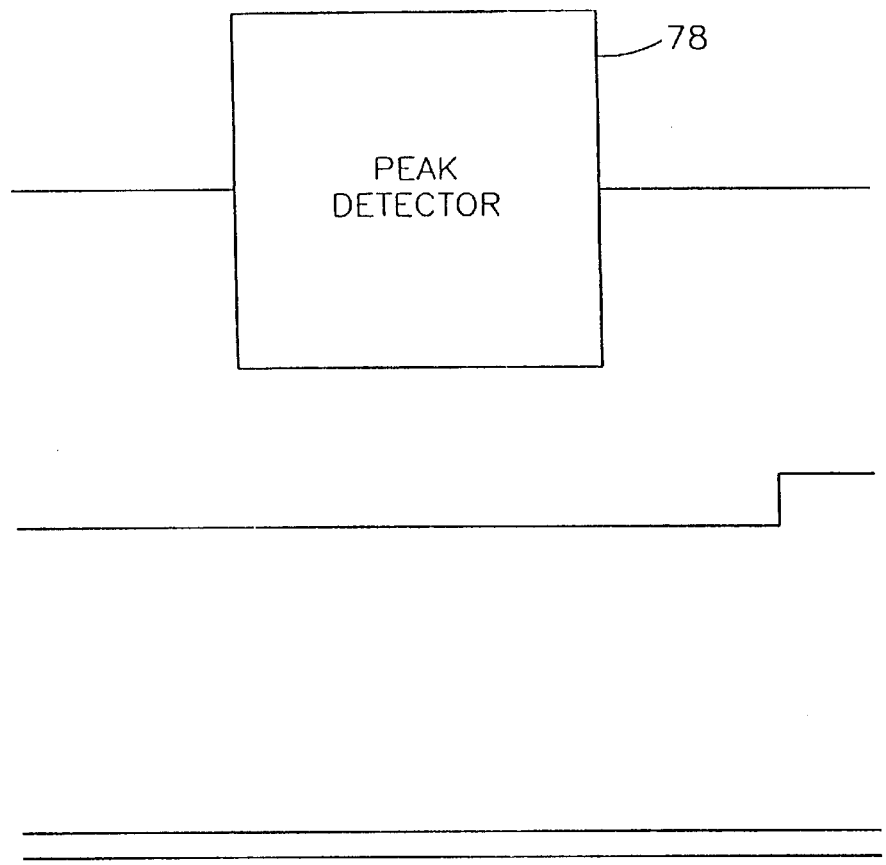
Figure 2G:
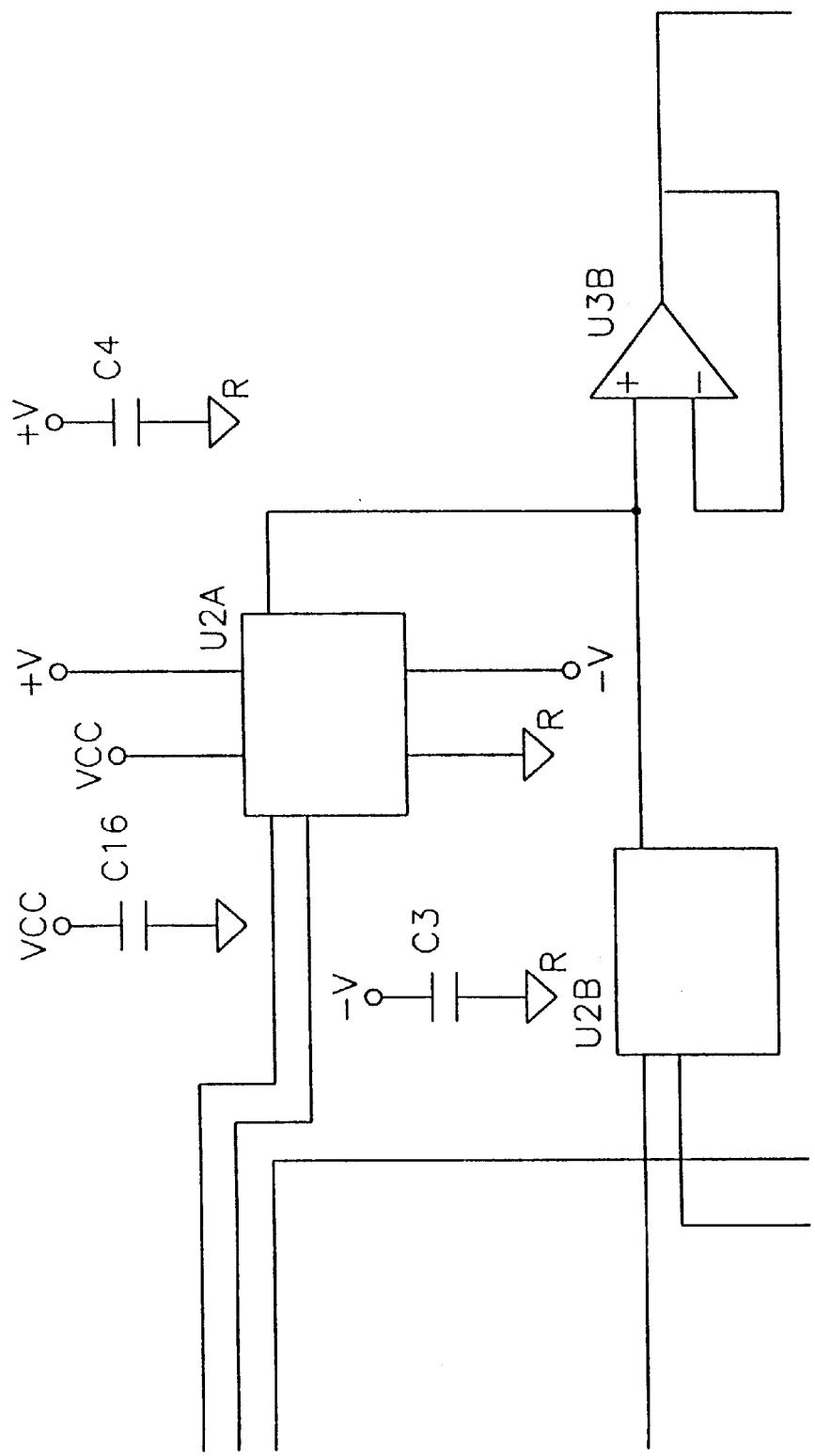
Figure 2H:
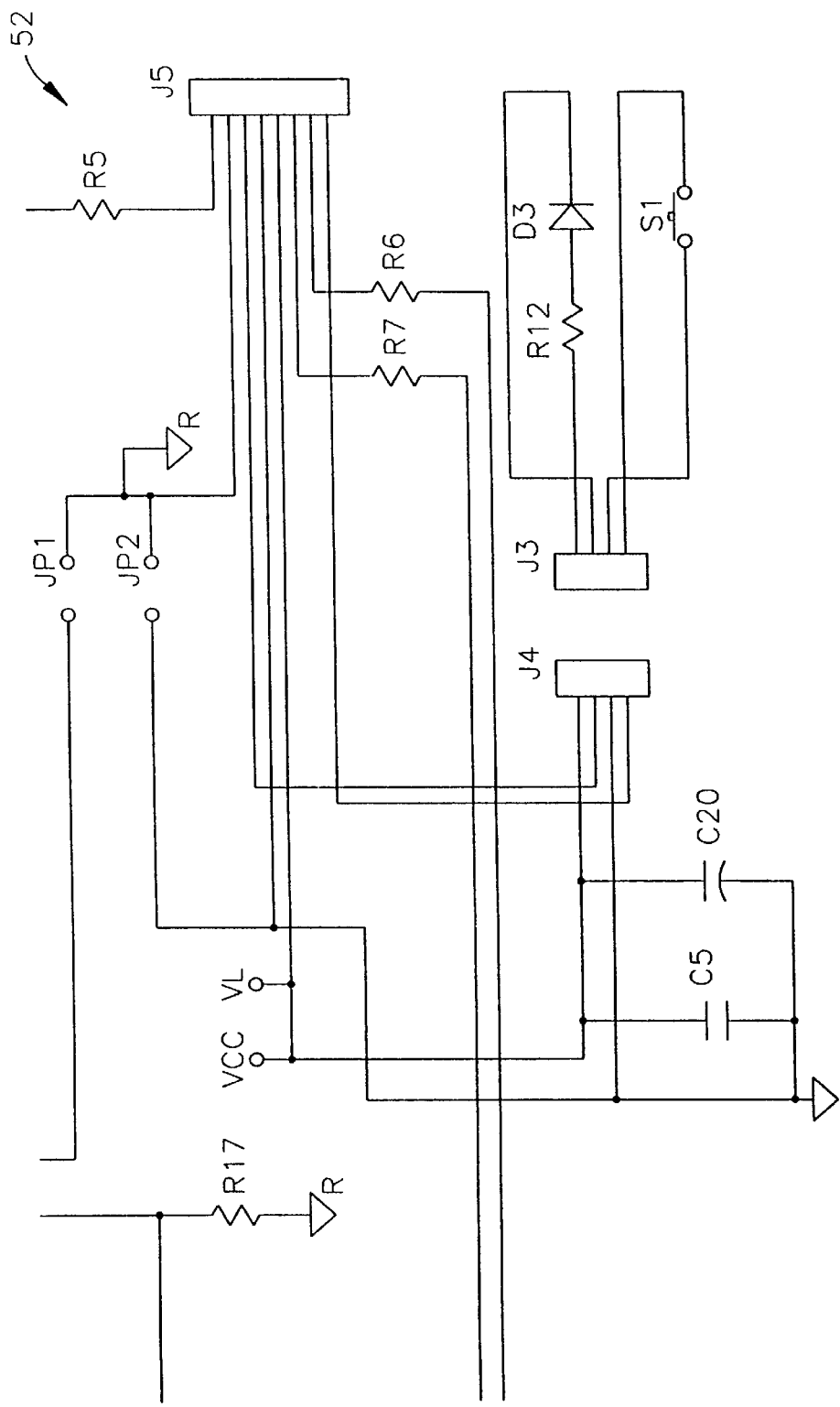

Shown in FIGS. 2A–2H, is a peak voltage circuit 70 having a signal-in port J2 with an input that is an electrical communication with the probe assembly 30 for receiving an electrical signal from the rotating machine shaft 14. The signal-in port at J2 has an output that is in electrical communication with an input of a peak detector 78, as shown in FIG. 2F, for sampling and holding the electrical signal obtained from the rotating machine shaft 14 and producing a peak voltage signal corresponding to peak voltage on the rotating machine shaft 14. The peak detector 78 has an output that is in communication with an input of a signal-out port J5.

In the preferred embodiment, as shown in FIG. 2C, an amplifier U3A having an input coupled to the output of the signal-in port J2 is included for receiving the electrical signal and producing an amplified electrical signal therefrom. The amplifier U3A also includes an output that is coupled to the input of decoder U1A, (FIG. 2D) which is used to control relays K1 and K2 as well as analog switches U2A, U2B, U2C, and U2D thereby controlling the selected measurement circuit and acting as analog control circuitry responsive to analog control signals for switching the analog circuit 50 between the first and second modes of operation of circuit 50.

The peak voltage circuit 70 further includes a first buffer 72 (FIG. 2D) that has an input coupled to the output of amplifier U3A for doubling the gain of the amplified electrical signal, a full wave precision rectifier 74, which has an input coupled to the output of the first buffer 72 is also included for rectifying the amplified electrical signal. The rectifier 74 has an output that is coupled to the input of the peak detector 78. Coupled to the output of the peak detector 78 is an analog switch U2B that has an output coupled to an input of an amplifier buffer U3B. The amplifier U3B has an output that is coupled to the input of the signal-out port J5.

When it is desired to measure voltage peaks appearing on the rotating machine shaft 14, the electrical signal thereon is applied through amplifier U3A to buffer 72 that has a gain of 2. The buffer 72 supplies the full wave precision rectifier 74 and the output is then applied to peak detector 78. Ideally, the peak detector 78 has a one hundred millisecond time constant for decay, thus effectively operating as a peak and hold circuit with a decay of one hundred milliseconds. The output of the peak detector 78 is then applied through analog switch U2B, and amplifier buffer U3B to the output of the signal-out port J5.

Figure 2I:
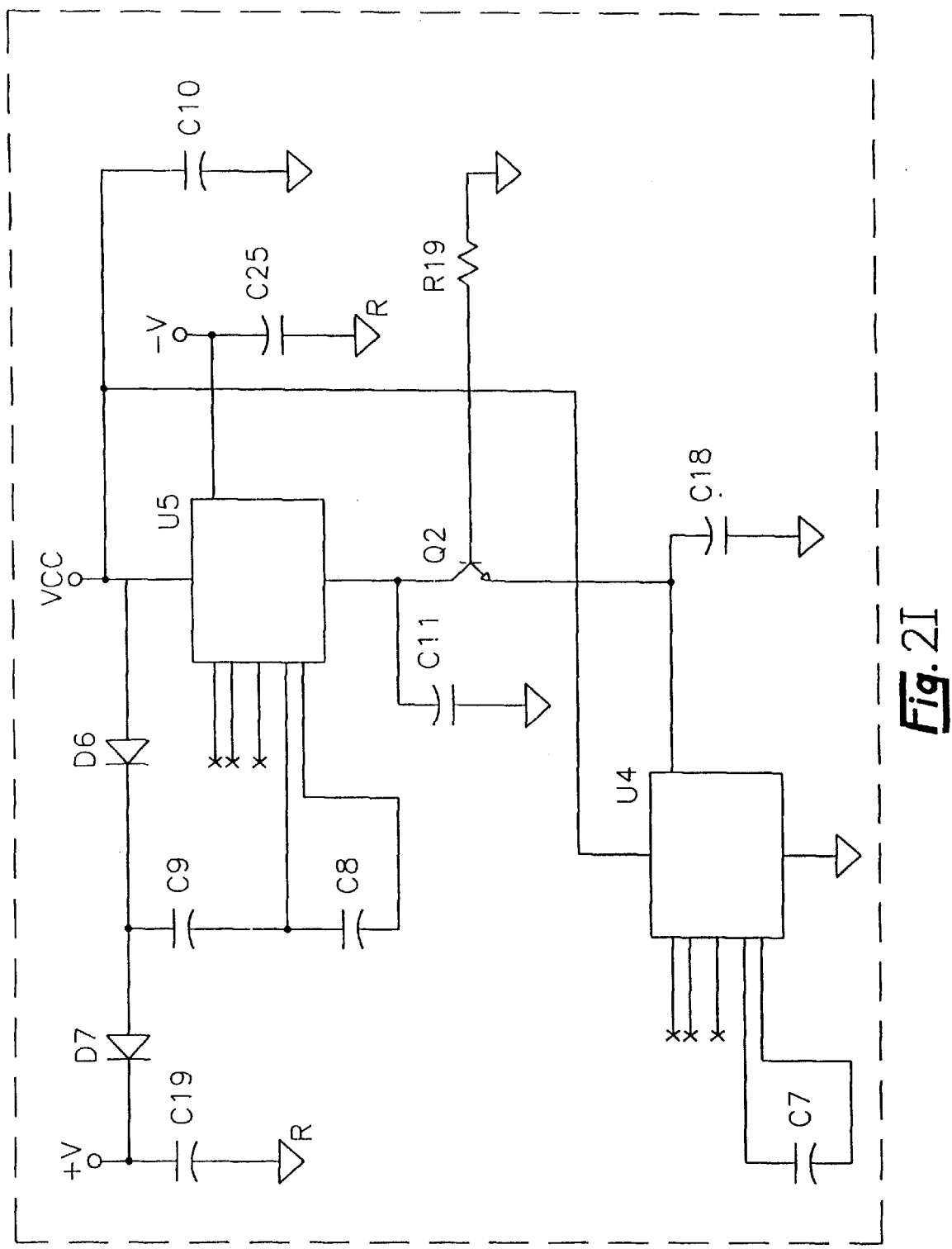
FIG. 2I is an electrical schematic diagram of a power supply of the present invention.

As shown in FIG. 2I, a power supply 58 is included to supply power to the current circuit 50, RMS voltage circuit 60, and peak voltage circuit 70. The power supply 58 produces plus or minus 12 volts and is fed from a 5 volt DC power supply contained within the data processing system 48.

Figure 3:
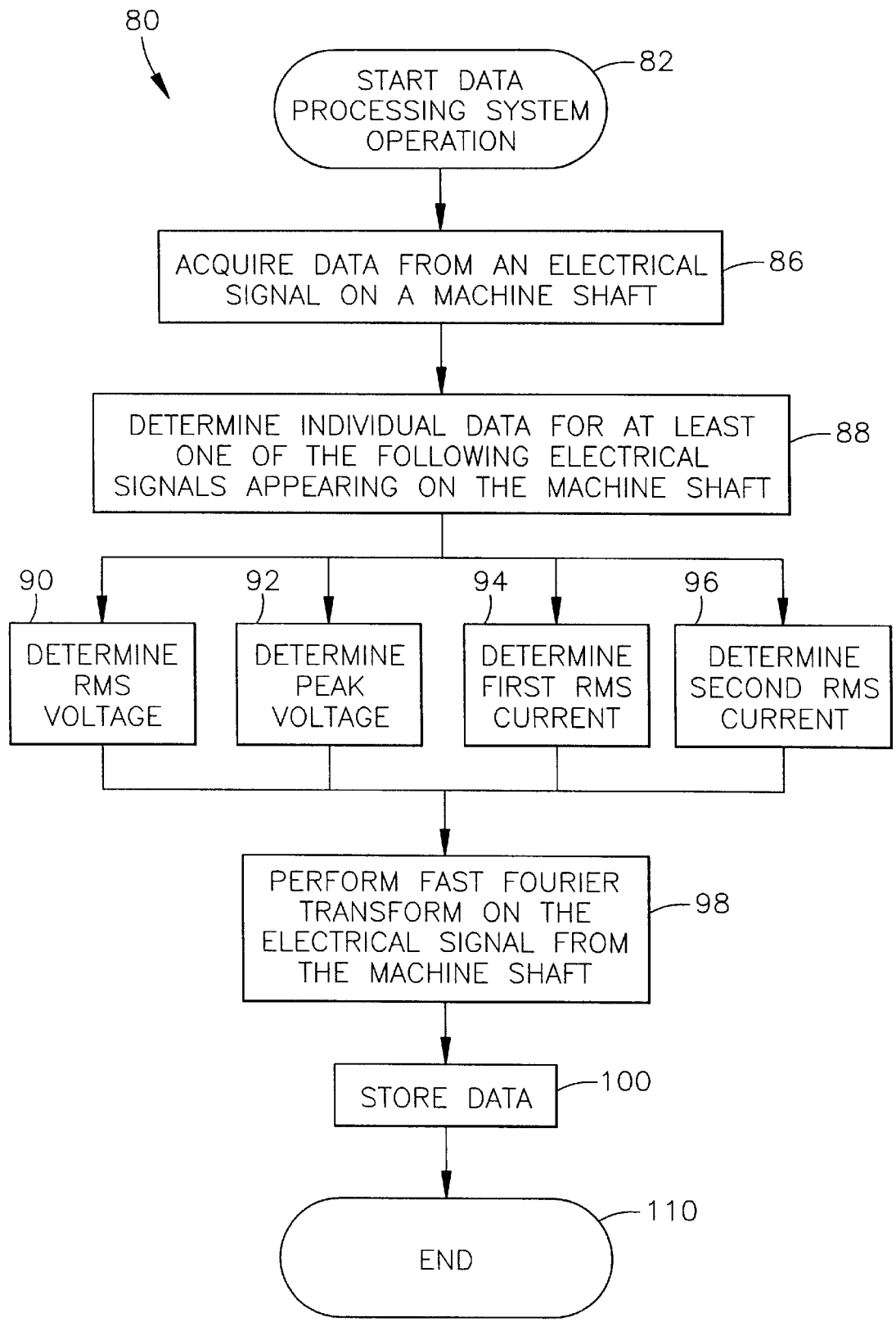
FIG. 3 is a flow chart method of the present invention.

Referring now to FIG. 3, a method 80 for measuring and analyzing electrical signals appearing on the rotating machine shaft 14 is shown. In operation, the method 80 begins data processing system operations in bubble 82. Approximately one minute is used by the data processing system 48 for acquiring various inputs by switching the probe assembly 30 through various operating modes. The method 80 then falls to block 86 whereby data is acquired from an electrical signal appearing on the rotating machine shaft 14. In operation, an operator simply presses a button on the keypad 26 of the data collection device 24 or a button or the shaft probe and holds the bristle brush 34 of the probe assembly 30 against the rotating machine shaft 14 for about fifteen seconds while data is being acquired. Typically, seven pieces of data are acquired from the electrical signal appearing on the rotating machine shaft 14 including the RMS AC voltage, the DC voltage, the peak voltage, the RMS AC current through first resistor R14, the RMS AC current through second resistor R15, the DC current through first resistor R14, and the DC current through second resistor R15. This individual data is determined in block 88 of the method 80 whereby, the RMS voltage is determined in block 90, the peak voltage is determined in block 92, a first RMS current is determined in block 94, and a second RMS current is determined in block 96.

Once at least one of these of these values is determined by the data processing system 48, the method 80 falls to block 98 whereby a Fast Fourier Transform is performed on one or more of the: (1) RMS AC voltage; (2) peak voltage; and (3) RMS AC currents determined in blocks 90, 92, 94, and 96, respectively. The Fast Fourier Transform can then be used to produce a frequency spectrum over time to analyze the possible source of the electrical signal appearing on the rotating machine shaft 14.

The method 80 next falls to block 100 where this data is stored in memory of the data processing system 48. When the first RMS current and second RMS current are determined in blocks 94 and 96, respectively, the method 80 determines if the current flowing through resistors R14 and R15 vary by a factor equal to the difference of their respective resistance values. If the currents vary by more than that factor, an indicator is made to the operator of the data processing system 48 that a possible error has occurred. Finally, the method 80 falls to bubble 110 and ends.

While the invention has been described in detail, it is to be expressly understood that it will be apparent to persons skilled in the relevant art that the invention may be modified without departing from the spirit of the invention. Various changes of form, design or arrangement may be made to the invention without departing from the spirit and scope of the invention. Therefore, the above mentioned description is to be considered exemplary, rather than limiting, and the true scope of the invention is that defined in the following claims.

What is claimed is:

1. An apparatus for monitoring electrical signals appearing on a rotating shaft, comprising:

a probe for electrically engaging the rotating shaft and producing a probe signal corresponding to the electrical signals appearing on the rotating shaft;

an analog circuit for receiving the probe signal and operating in at least first and second modes of operation for producing first and second mode signals, respectively, corresponding to first and second parameters, respectively, of the probe signal;

analog control circuitry responsive to analog control signals for switching the analog circuit between the first and second modes of operation; and a microprocessor based analyzer for selecting and receiving one of the first and second mode signals, for analyzing the first and second mode signals, for storing data corresponding to the first and second mode signals, and for producing and transmitting the analog control signals to the analog circuit to select a first or second mode of operation of the analog circuit.

2. The apparatus of claim 1 wherein the analog circuit further comprises first and second current sensing circuits for receiving the probe signal and producing first and second current signals, respectively, corresponding to the current flowing from the rotating shaft, the analyzer being operable to compare the first and second current signals and based thereon determine accuracy or inaccuracy of the first and second current signals.

3. The apparatus of claim 1 wherein the analog circuit further comprises a peak circuit for receiving the probe signal and producing a peak signal corresponding to the peak electrical voltage appearing on the shaft during a predetermined time, the analyzer receiving the peak signal and storing data corresponding to the peak signal.

4. The apparatus of claim 1 wherein the analog circuit comprises:

first and second current circuits for receiving the probe signal and producing first and second current signals, respectively, corresponding to the current flowing from the rotating shaft;

a peak circuit for receiving the probe signal and producing a peak signal corresponding to a peak voltage appearing on the probe shaft during a predetermined time;

an RMS voltage circuit for receiving the probe signal and for producing an RMS voltage signal corresponding to the RMS voltage appearing on the rotating shaft; and the analog control circuitry further comprising controllable relay circuits responsive to the analog control signal for selecting one of the first current signal, the second current signal, the peak signal, or the RMS voltage signal to produce a selected signal that is output to the analyzer.

5. The apparatus of claim 1 wherein the analyzer further comprises a memory and a program stored in the memory for producing the control signals based on the program to analog control each mode of operation of the analog circuit.

6. The apparatus of claim 1 wherein the analyzer further comprises a memory and a program stored in the memory, the program including a route of machines and control data associated with each machine, the analyzer producing the analog control signal based on input to a particular machine on the route and the control data corresponding to the particular machine.

7. The apparatus of claim 1 wherein the electrical signals are tracked over time.

8. The apparatus of claim 1 wherein the analyzer computes Fast Fourier Transforms on the electrical signals.

9. A system for monitoring an electrical signal appearing on a rotating machine shaft, the system comprising:

a probe assembly for placement against the rotating machine shaft and in electrically conductive contact therewith, the probe assembly including a circuit comprising:

a signal-in port having an input in electrical communication with the electrical signal from the rotating machine shaft, and an output;

an amplifier having an input coupled to the signal-in port output for amplifying the electrical signal from the rotating machine shaft and producing an amplified electrical signal, and an output;

a signal-out port having an input and an output;

an analog switch coupled between the signal-out port input and the amplifier output for receiving the amplified electrical signal from the amplifier and switching the amplified electrical signal to the signal-out port; and a data processing system having an input in electrical communication with the signal-out port output for receiving the amplified electrical signal, computing Fast Fourier Transforms on the amplified electrical signal.

10. The system of claim 9 wherein the data processing system produces frequency spectrums as a function of time from the Fast Fourier Transforms on the amplified electrical signal.

11. The system of claim 9 wherein the electrical signal is tracked over time.

12. The system of claim 9 wherein the data processing system further comprises a memory and a program stored in the memory, the program including a route of machines and control data associated with each machine, the data processing system producing a control signal based on input to a particular machine on the route and the control data corresponding to the particular machine.

13. A system for monitoring an electrical signal appearing on a rotating machine shaft, the system comprising:

a probe assembly for placement against the rotating machine shaft and in electrically conductive contact therewith, the probe assembly including a circuit comprising:

a signal-in port having an input in electrical communication with the probe assembly for receiving the electrical signal from the rotating machine shaft, and an output;

a peak detector having an input in electrical communication with the signal-in port output for sampling and holding the electrical signal from the rotating machine shaft and producing a peak voltage signal corresponding to peak voltage on the rotating machine shaft, and an output; and a signal-out port having an output, and an input coupled to the peak detector output.

14. The system of claim 13 further including a data processing system in communication with the signal-out port output for receiving the peak voltage signal.

15. The system of claim 14 wherein the electrical signal is tracked over time.

16. The system of claim 13 further including a data processing system having an input in electrical communication with the signal-out port output for receiving the electrical signal.

17. The system of claim 16 wherein the data processing system further comprises a memory and a program stored in the memory, the program including a route of machines and control data associated with each machine, the data processing system producing a control based on input to a particular machine on the route and the control data corresponding to the particular machine.

* * * * *